(12) United States Patent
Huang et al.

(10) Patent No.: US 8,736,362 B2
(45) Date of Patent: May 27, 2014

(54) PULSE WIDTH MODULATION SIGNAL GENERATING CIRCUIT AND AMPLIFIER CIRCUIT WITH BEAT FREQUENCY CANCELLATION CIRCUIT

(75) Inventors: Chun-Jen Huang, New Taipei (TW);
Jiann-Chyi Rau, New Taipei (TW);
Hsin-Hung Wang, Taipei (TW)

(73) Assignee: Princeton Technology Corporation, New Taipei (TW)

( * ) Notice: Subject to any disclaimer, the term of this patent is extended or adjusted under 35 U.S.C. 154(b) by 36 days.

(21) Appl. No.: 13/414,218

(22) Filed: Mar. 7, 2012

(65) Prior Publication Data

US 2012/0229207 A1 Sep. 13, 2012

(30) Foreign Application Priority Data

Mar. 8, 2011 (TW) .............................. 100204056 U

(51) Int. Cl.
*H03F 3/38* (2006.01)
(52) U.S. Cl.
CPC ...................................... *H03F 3/38* (2013.01)

USPC ............. 330/10; 330/251; 330/207; 332/109; 381/123; 370/212; 375/238

(58) Field of Classification Search
CPC .......................................................... H03F 3/38
USPC ........ 330/9, 10, 251, 124 R, 207 A; 375/238; 381/120–121
See application file for complete search history.

(56) References Cited

U.S. PATENT DOCUMENTS

| | | | | |
|---|---|---|---|---|
| 2,351,191 A | * | 6/1944 | Crosby ............................ | 455/305 |
| 6,876,253 B2 | * | 4/2005 | Tellier et al. ........................ | 330/9 |
| 7,538,611 B2 | * | 5/2009 | Chen et al. ..................... | 330/251 |
| 8,289,075 B2 | * | 10/2012 | Kishii et al. ..................... | 330/51 |

* cited by examiner

*Primary Examiner* — Robert Pascal
*Assistant Examiner* — Khiem Nguyen
(74) *Attorney, Agent, or Firm* — Muncy, Geissler, Olds & Lowe, P.C.

(57) ABSTRACT

A beat frequency cancellation circuit, for an amplifier, includes a coupling device connected between two signal processing paths of the amplifier for compensating for beat frequency effects of output signals between the signal processing paths.

8 Claims, 6 Drawing Sheets

PULSE WIDTH MODULATION SIGNAL GENERATING CIRCUIT AND AMPLIFIER CIRCUIT WITH BEAT FREQUENCY CANCELLATION CIRCUIT

CROSS REFERENCE TO RELATED APPLICATIONS

This Application claims priority of Taiwan Patent Application No. 100204056, filed on Mar. 8, 2011, the entirety of which is incorporated by reference herein.

BACKGROUND OF THE INVENTION

1. Field of the Invention

The invention relates to a multi-channel amplifier circuit, and more particularly to a multi-channel amplifier circuit with a beat frequency cancellation circuit capable of cancelling beat frequency effects between different channels.

2. Description of the Related Art

As technologies advance, the variety of functions provided by portable electronic devices (such as mobile phones, personal digital assistant, tablet computer, or others) has been greatly increased. Among them, recently, multimedia services have become one of the fundamental features that are provided with portable electronic devices. In order to generate high quality audio signals, a power-saving and high efficiency power amplifier is required. A class D amplifier is a preferable choice for small-sized electronic devices since the circuit area of the class D amplifier is small, and amplifying efficiency of the class D amplifier can be over 90%. Therefore, the class D amplifier has replaced the class AB amplifier and has become main stream when applying audio power amplifiers.

The class D amplifier is also called a digital power amplifier, which modulates and amplifies input analog signals and generates digital amplified output signals. FIG. 1 shows a circuit diagram of a basic class D power amplifier, in which a pulse width modulation (PWM) modulator 101 modulates an input signal Vin to generate a digital signal. The digital signal is transmitted to the driver circuits 102 and 103, and amplified and output by the power transistors Q1 and Q2. Finally, a low pass filter 104 extracts the original audio signal at the input terminals and transmits the extracted signal to the loud speaker 105.

Because the inputs of the power transistors are digital signals, the power transistors Q1 and Q2 work in the saturation and cut-off states. For this reason, the power consumed by the power transistors Q1 and Q2 is very small, which not only increases overall efficiency of the power amplifier, but also allows the size of a heat dissipation device to be small. Hence, the size of the electronic components of a class D amplifier can be small. Moreover, while, in general, the amplifying efficiency of a class AB amplifier is only about 50%, the amplifying efficiency of the class D amplifier can be over 90%, and even approach 100%. Therefore, the class D amplifier is greatly used in the audio power amplifying fields.

However, for multi-channel audio signal amplifying applications, the different channel digital signals may have different oscillation frequencies after being modulated. The frequency differences between the audio signals in different channels cause a beat frequency effect. When the frequency difference falls to a frequency band perceptible by human ears, a beat tone may become noise heard by a user when there is no audio signal being input.

Therefore, the noise caused by the beat frequency in multi-channel audio amplifier is a problem desired to be solved.

BRIEF SUMMARY OF THE INVENTION

Beat frequency cancellation circuits, pulse width modulation (PWM) signal generating circuits and amplifier circuits are provided. According to an embodiment of the invention, a beat frequency cancellation circuit for an amplifier comprises a coupling device coupled between two signal processing paths of the amplifier to compensate for beat frequency effects of output signals between the signal processing paths.

According to another embodiment of the invention, a PWM signal generating circuit comprises at least two PWM modulators and at least one coupling device. Each PWM modulator receives an input signal through an input terminal and generates a PWM signal according to the input signal. The coupling device is coupled between the input terminals for synchronizing oscillating frequencies of the input signals at the input terminals.

According to yet another embodiment of the invention, an amplifier circuit comprises at least two signal processing paths and a coupling device. Each signal processing path comprises a pulse width modulation (PWM) modulator, a driving circuit and an output circuit. The PWM modulator generates a PWM signal according to an input signal from an input terminal of the signal processing path. The driving circuit is coupled to the PWM modulator for generating a driving signal according to the PWM signal. The output circuit is coupled to the driving circuit for generating an amplified output signal according to the driving signal. The coupling device is coupled between the at least two signal processing paths for synchronizing oscillating frequencies of the input signals.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
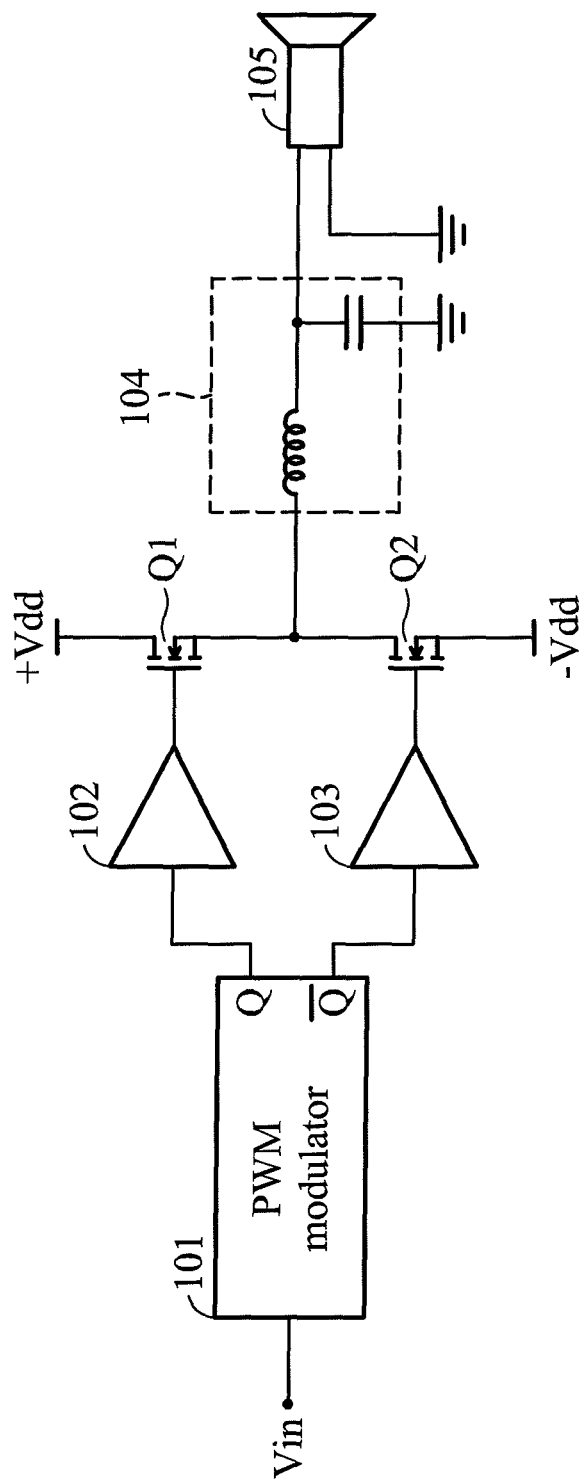
FIG. 1 shows a block diagram of a basic class D power amplifier.
Figure 2:
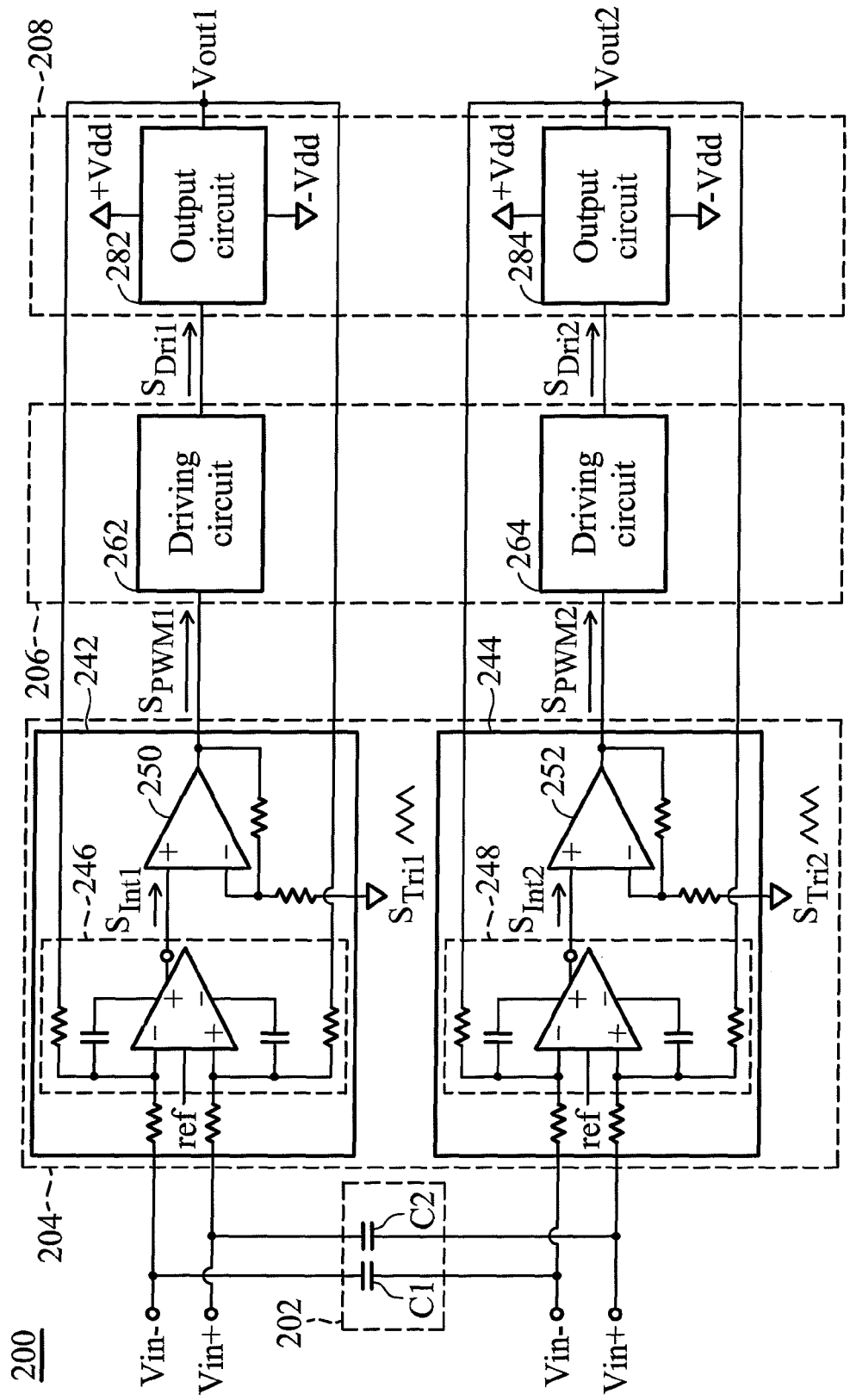
FIG. 2 shows an amplifier circuit according to an embodiment of the invention.

FIG. 2 shows an amplifier circuit according to an embodiment of the invention. In the embodiments of the invention, the amplifier circuit 200 may be applied in the dual-channel or multi-channel audio signal amplifying fields. Therefore, the amplifier circuit 200 may comprise at least two signal processing paths, wherein each signal processing path is arranged to output an amplified output signal. As shown in the dual-channel embodiment in FIG. 2, the amplifier circuit 200 may generate two amplified output signals Vout1 and Vout2 respectively on the two signal processing paths according to the differential input signals Vin+ and Vin−. The amplified output signals Vout1 and Vout2 may further be transmitted to the loud speaker (not shown in FIG. 2) so as to generate a stereo sound effect.

As shown in FIG. 2, the amplifier circuit 200 may comprise a coupling device 202, a pulse width modulation (PWM) signal generating circuit 204, a driving stage circuit 206 and an output stage circuit 208. The PWM signal generating circuit 204 may comprise PWM modulators 242 and 244, where each PWM modulator may comprise an integrator 246 or 248 and a comparator 250 or 252. The integrators 246 and 248 may receive the differential input signals Vin+ and Vin− at the input terminals, a reference voltage level ref and a feedback of the amplified output signals Vout1 and Vout2. The integrators 246 and 248 may further integrate the received signals and generate the integration signals $S_{Int1}$ and $S_{Int2}$, respectively. The comparators 250 and 252 may receive the integration signals $S_{Int1}$ and $S_{In2}$ and reference signals $S_{Tri1}$ and $S_{Tri2}$, and compare signal levels of the integration signals $S_{Int1}$ and $S_{Int2}$ and the reference signals $S_{Tri1}$ and $S_{Tri2}$ to generate the PWM signals $S_{PWM1}$ and $S_{PWM2}$, respectively.

The driving stage circuit 206 may comprise driving circuits 262 and 264, for generating the driving signals $S_{Dri1}$ and $S_{Dri2}$ according to the PWM signals $S_{PWM1}$ and $S_{PWM2}$, respectively. The output stage circuit 208 may comprise the output circuits 282 and 284, which are driven by the driving signals $S_{Dri1}$ and $S_{Dri2}$ for generating the amplified output signals Vout1 and Vout2 to drive the load of the loud speaker (not shown).

Note that, conventionally, dual-channel or multi-channel amplifier circuits are carried out by coupling two or more single channel amplifier chips to generate stereo sound effect, wherein each single channel amplifier chip is arranged to generate one amplified output signal. In other words, for example, in the conventional design, a dual channel amplifier circuit is implemented by coupling two single channel amplifier chips together, wherein each amplifier chip is arranged to process a signal in one signal processing path so as to generate an amplified output signal. However, according to an embodiment of the invention, the dual-channel amplifier circuit 200 as shown in FIG. 2 may be integrated in one single chip. In the conventional design, when using different amplifier chips to process signals on different signal processing paths, the reference signals of different amplifier chips are independent from each other. Therefore, there is no interference generated between different channels. However, when integrating two or more signal processing paths in a single chip as shown in FIG. 2, the oscillating frequencies of the reference signals $S_{Tri1}$ and $S_{Tri2}$ may be different from each other due to inter-chip interference, causing the beat frequency effect in the output audio signals. When the frequency difference falls to a frequency band perceptible to human ears, a noisy beat tone may be heard by a user when there is no audio signal being input.

Therefore, according to an embodiment of the invention, in order to cancel the frequency difference between the amplified output signals, the amplifier circuit 200 may further comprise a coupling device 202 coupled between the input terminals to compensate for the beat frequency effect between the amplified output signals on different signal processing paths, by synchronizing oscillating frequencies of the input signals at the input terminals. Thus, after synchronization, the oscillating frequencies of the input signals can be substantially the same.

According to an embodiment of the invention, the coupling device 202 is utilized for alternating current (AC) coupling the input signals at the input terminals at high frequencies, so as to compensate for the above-mentioned frequency differences between input signals. Therefore, the oscillating frequencies of the input signals can be synchronized and the beat frequency effect can be cancelled. For example, according to one embodiment of the invention, before synchronization, the oscillating frequencies of the amplified output signals Vout1 and Vout2 are 574.2 kH and 564.7 kHz, respectively. The frequency difference is 9.5 Hz. After synchronization by the coupling device, both of the oscillating frequencies of the amplified output signals can be adjusted to 573.7 kHz.

According to an embodiment of the invention, the coupling device 202 may comprise capacitors C1 and C2 coupled between the input terminals of the amplifier circuit 200 for AC coupling the signals at the input terminals. In this manner, even if the oscillating frequencies of the reference signals $S_{Tri1}$ and $S_{Tri2}$ of the amplifier circuit 200 are different, the frequency difference between the PWM signals $S_{PWM1}$ and $S_{PWM2}$ and the amplified output signals Vout1 and Vout2 may be reduced, or cancelled.

Figure 3:
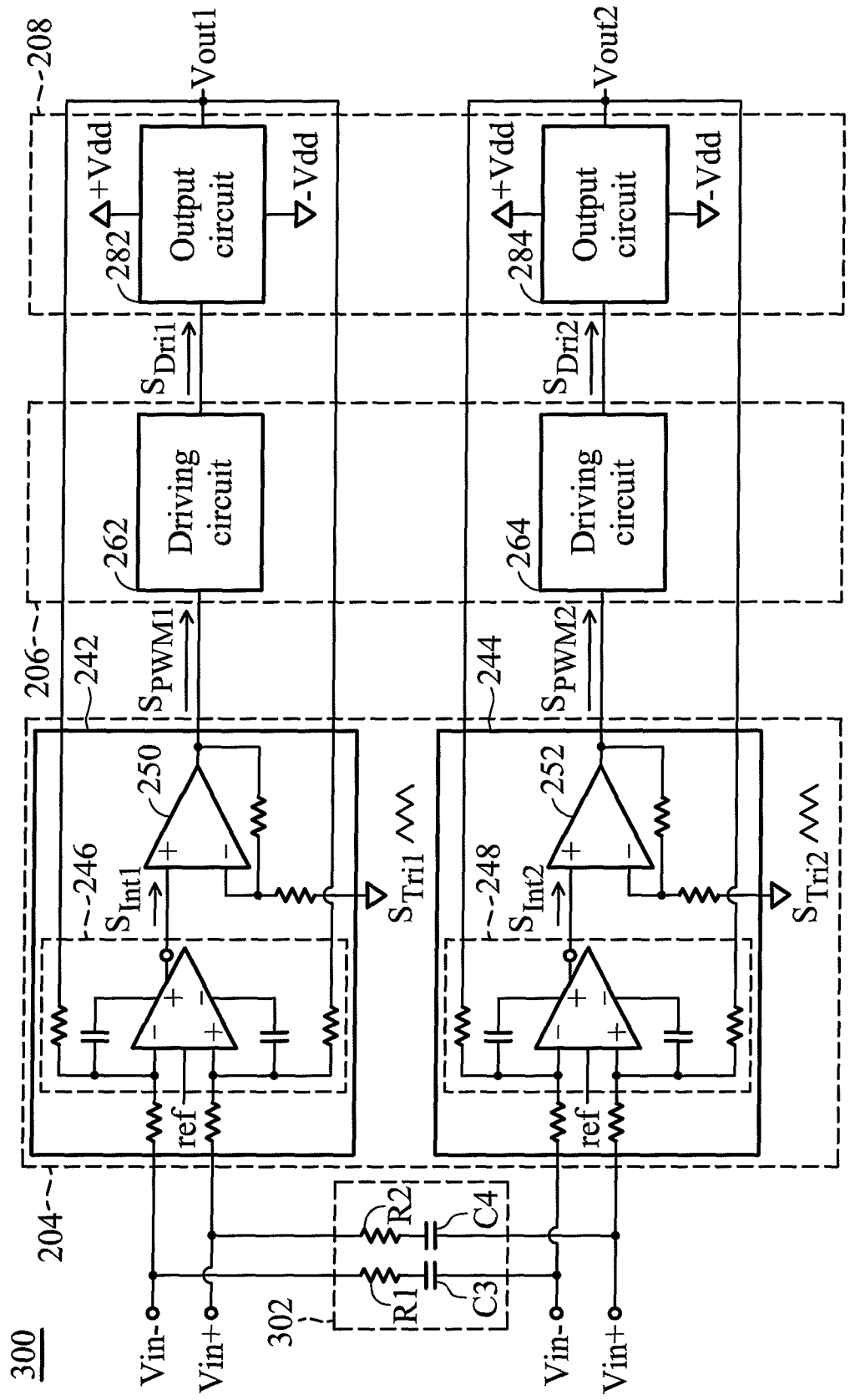
FIG. 3 shows an amplifier circuit according to another embodiment of the invention.

FIG. 3 shows an amplifier circuit according to another embodiment of the invention. As shown in FIG. 3, most of the elements of the amplifier circuit 300 are the same as the elements of the amplifier circuit 200 as shown in FIG. 2. Therefore, introductions of the same elements are omitted here for brevity. Reference may be made to the corresponding descriptions of FIG. 2. In the embodiment, the coupling device 302 may comprise serially coupled capacitors and resistors, such as the capacitor C3 and the resistor R1 and the capacitor C4 and the resistor R2, respectively coupled between the input terminals of the amplifier circuit 300. The capacitors are utilized for AC coupling the signals at the input terminals, and the resistors are utilized to hinder the signals from leaking from one signal processing path to another via the capacitors C3 and C4.

Figure 4:
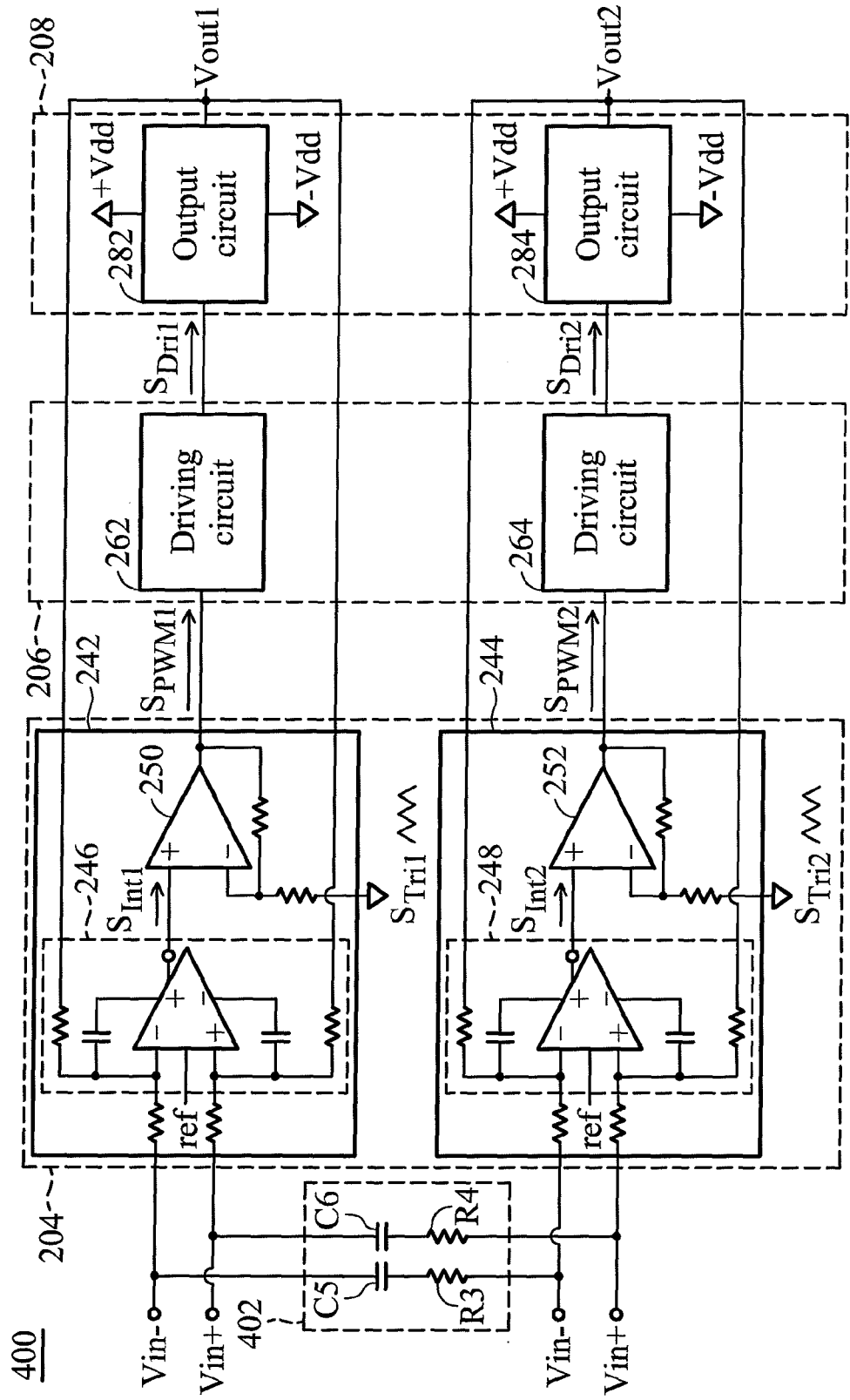
FIG. 4 shows an amplifier circuit according to yet another embodiment of the invention.

FIG. 4 shows an amplifier circuit according to yet another embodiment of the invention. As shown in FIG. 4, most of the elements of the amplifier circuit 400 are the same as the elements of the amplifier circuit 200 as shown in FIG. 2. Therefore, introductions of the same elements are omitted here for brevity. Reference may be made to the corresponding descriptions of FIG. 2. In the embodiment, the coupling device 402 may comprise serially coupled capacitors and resistors, such as the capacitor C5 and the resistor R3 and the capacitor C6 and the resistor R4, respectively coupled between the input terminals of the amplifier circuit 400. The capacitors are utilized for AC coupling the signals at the input terminals, and the resistors are utilized to hinder the signals from leaking from one signal processing path to another via the capacitors C5 and C6.

Figure 5:
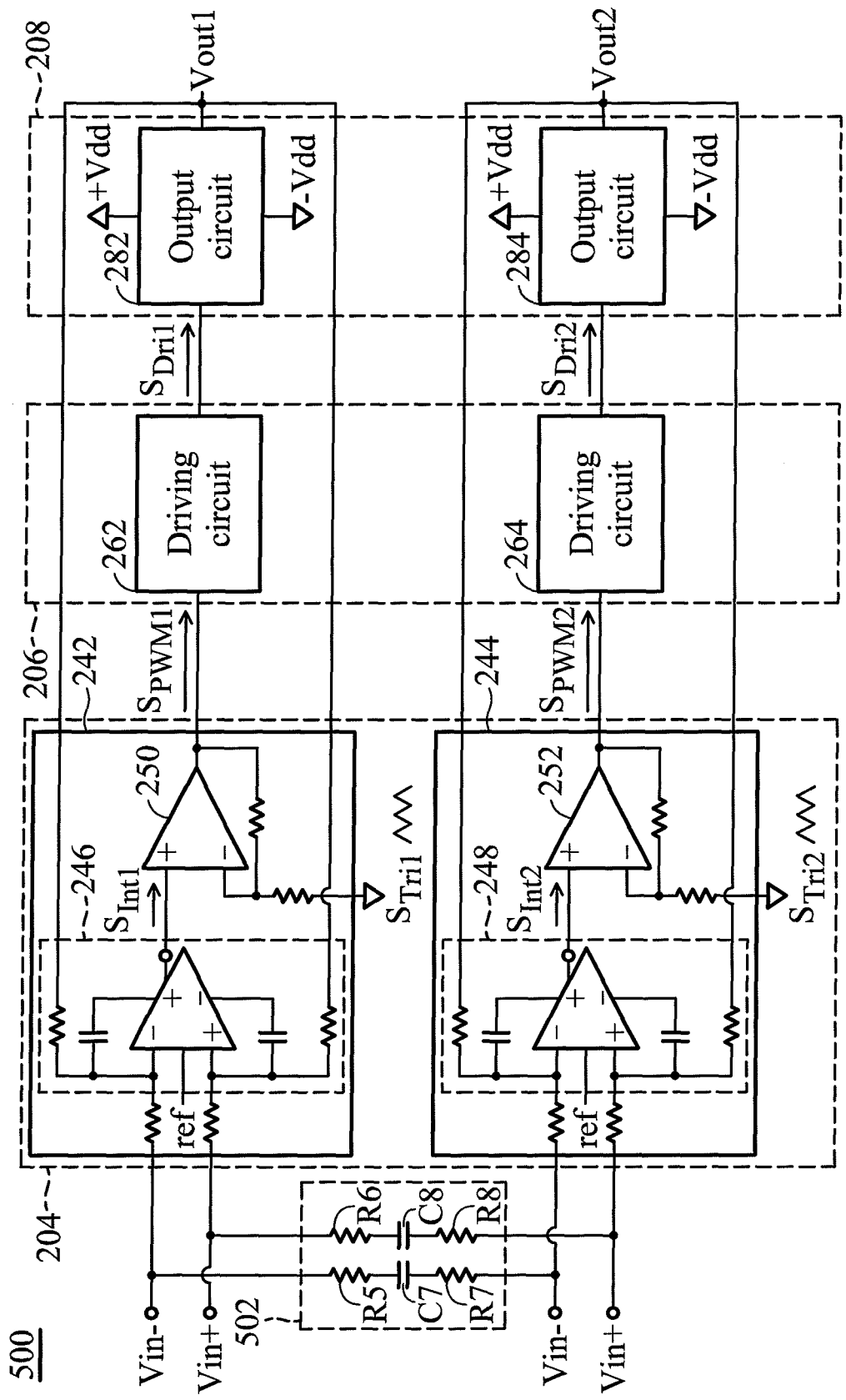
FIG. 5 shows an amplifier circuit according to yet another embodiment of the invention.

FIG. 5 shows an amplifier circuit according to yet another embodiment of the invention. As shown in FIG. 5 most of the elements of the amplifier circuit 500 are the same as the elements of the amplifier circuit 200 as shown in FIG. 2. Therefore, introductions of the same elements are omitted here for brevity. Reference may be made to the corresponding descriptions of FIG. 2. In the embodiment, the coupling device 502 may comprise serially coupled capacitors and resistors, such as the resistor R5, the capacitor C7 and the resistor R7, and the resistor R6, the capacitor C8 and the resistor R8, respectively coupled between the input terminals of the amplifier circuit 500. The capacitors are utilized for AC coupling the signals at the input terminals, and the resistors are utilized to hinder the signals from leaking from one signal processing path to another via the capacitors C7 and C8.

Figure 6:
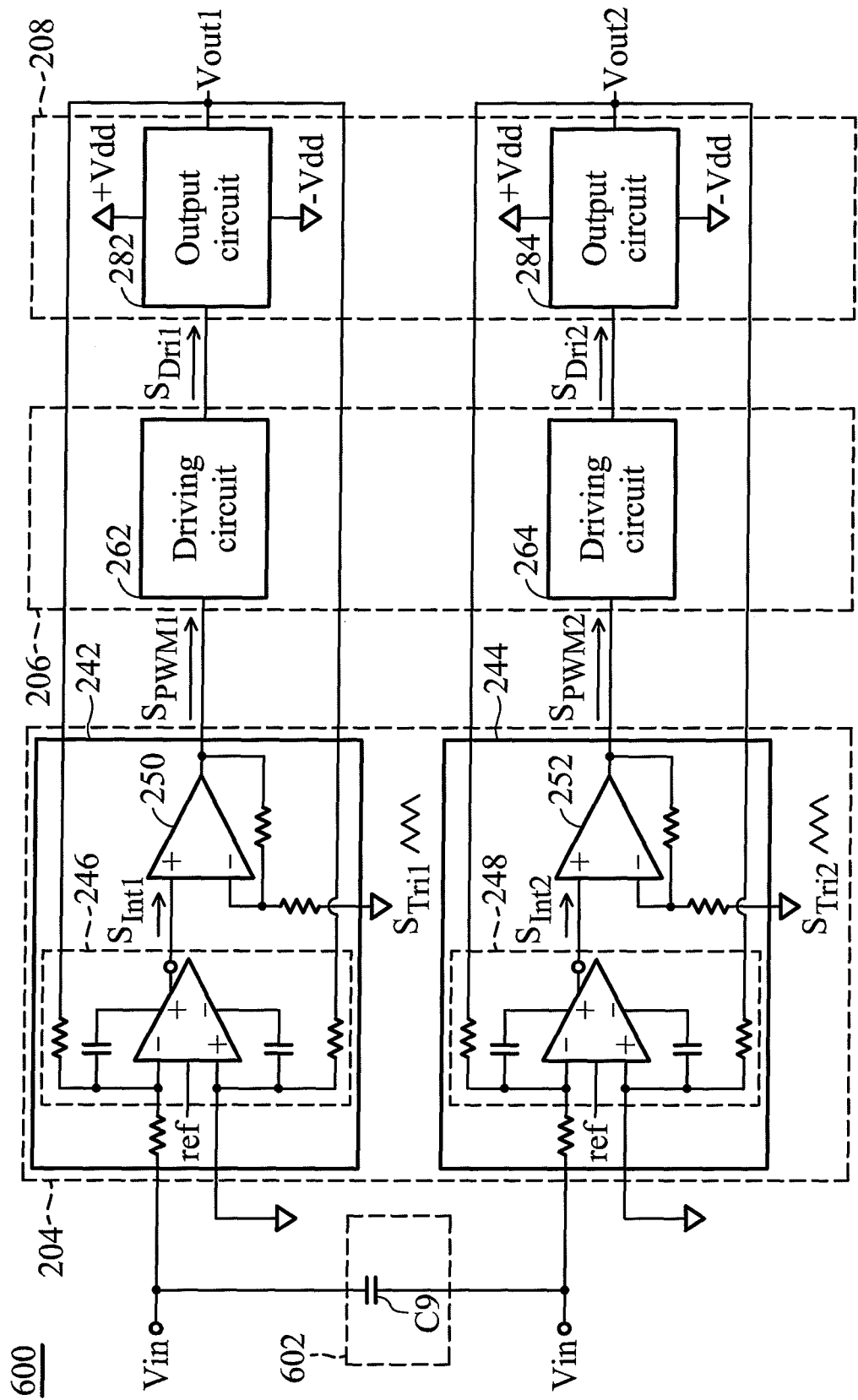
FIG. 6 shows an amplifier circuit according to yet another embodiment of the invention.

FIG. 6 shows an amplifier circuit according to yet another embodiment of the invention. As shown in FIG. 6, most of the elements of the amplifier circuit 600 are the same as the elements of the amplifier circuit 200 as shown in FIG. 2. Therefore, introductions of the same elements are omitted here for brevity. Reference may be made to the corresponding descriptions of FIG. 2. In the embodiment, the amplifier circuit 600 comprises a half-bridge coupled class D amplifier on each signal processing path. The coupling device 602 may comprise a capacitor C9 coupled between two input terminals for AC coupling the input signals Vin received at the input terminals. Note that the coupling device 602 may further comprise the current limiting resistors as shown in FIGS. 4-6, to hinder the signals from leaking from one signal processing path to another via the capacitor. In addition, in order to clarify the concept of the invention, dual-channel amplifier circuit embodiments were illustrated above. However, the invention is not limited to dual-channel amplifier circuits, and the concept may also be applied to multi-channel audio signal amplifying fields. Similarly, for the multi-channel audio signal amplifier circuit, by adding the proposed coupling device for synchronization of the oscillating frequencies, the oscillating frequencies of the signals at different channels may be synchronized to be substantially the same.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A pulse width modulation (PWM) signal generating circuit, comprising:

at least two PWM modulators, wherein each PWM modulator receives an input signal through an input terminal, and generates a PWM signal according to the input signal; and at least one coupling device coupled between the input terminals for synchronizing oscillating frequencies of the input signals at the input terminals.

2. The PWM signal generating circuit as claimed in claim 1, wherein the coupling device is alternating-current (AC) coupling the input signals.

3. The PWM signal generating circuit as claimed in claim 1, wherein the coupling device comprises a capacitor.

4. The PWM signal generating circuit as claimed in claim 1, wherein the PWM modulator comprises: an integrator for integration of the input signals to generate an integration signal; and a comparator for receiving the integration signal and a reference signal and comparing signal levels of the integration signal and the reference signal to generate the PWM signal.

5. An amplifier circuit, comprising: at least two signal processing paths, wherein each signal processing path comprises: (a) a pulse width modulation (PWM) modulator for generating a PWM signal according to an input signal from an input terminal of the signal processing path; (b) a driving circuit coupled to the PWM modulator for generating a driving signal according to the PWM signal; and (c) an output circuit coupled to the driving circuit for generating an amplified output signal according to the driving signal; and a coupling device coupled between the at least two signal processing paths for synchronizing the frequencies of the input signals.

6. The amplifier circuit as claimed in claim 5, wherein the coupling device is alternating-current (AC) coupling to the input signals.

7. The amplifier circuit as claimed in claim 5, wherein the coupling device comprises a capacitor.

8. The amplifier circuit as claimed in claim 5, wherein the coupling device comprises a capacitor and a resistor coupled in serial.

* * * * *